US010892334B2

United States Patent
Eto et al.

(10) Patent No.: US 10,892,334 B2
(45) Date of Patent: Jan. 12, 2021

(54) N-TYPE SIC SINGLE CRYSTAL SUBSTRATE, METHOD FOR PRODUCING SAME AND SIC EPITAXIAL WAFER

(71) Applicant: SHOWA DENKO K.K., Tokyo (JP)

(72) Inventors: Kazuma Eto, Tsukuba (JP); Hiromasa Suo, Hikone (JP); Tomohisa Kato, Tsukuba (JP)

(73) Assignee: SHOWA DENKO K.K., Tokyo (JP)

( * ) Notice: Subject to any disclaimer, the term of this patent is extended or adjusted under 35 U.S.C. 154(b) by 42 days.

(21) Appl. No.: 16/333,269

(22) PCT Filed: Sep. 25, 2017

(86) PCT No.: PCT/JP2017/034499
§ 371 (c)(1),
(2) Date: Mar. 14, 2019

(87) PCT Pub. No.: WO2018/056438
PCT Pub. Date: Mar. 29, 2018

(65) Prior Publication Data
US 2019/0252504 A1    Aug. 15, 2019

(30) Foreign Application Priority Data

Sep. 26, 2016   (JP) .................... 2016-186907

(51) Int. Cl.
C30B 29/36    (2006.01)
C30B 23/02    (2006.01)
(Continued)

(52) U.S. Cl.
CPC .............. *H01L 29/36* (2013.01); *C30B 23/02* (2013.01); *C30B 23/06* (2013.01); *C30B 29/36* (2013.01);
(Continued)

(58) Field of Classification Search
CPC ... H01L 29/36; H01L 21/203; H01L 29/1608; H01L 29/045; C30B 23/06; C30B 33/02; C30B 23/02; C30B 29/36
See application file for complete search history.

(56) References Cited

U.S. PATENT DOCUMENTS 7,972,704 B2 *  7/2011  Ohtani ............. H01L 21/02529
                                                        428/446
2002/0189536 A1  12/2002  Otsuki et al.
(Continued)

FOREIGN PATENT DOCUMENTS

CN    101896647 A    11/2010
CN    104120489 A    10/2014
(Continued)

OTHER PUBLICATIONS

Tomohisa Kato et al., "Growth of low resistivity n-type 4H-SiC bulk crystals by sublimation method using co-doping technique", Mater. Sci. Forum, 2014, pp. 47-50, vols. 778-780.
(Continued)

*Primary Examiner* — David Vu
(74) *Attorney, Agent, or Firm* — Sughrue Mion, PLLC

(57) ABSTRACT

An n-type SiC single crystal substrate of the present invention is provided which is a substrate doped with both a donor and an acceptor, and has a difference between a donor concentration and an acceptor concentration in an outer peripheral portion which is smaller than a difference between a donor concentration and an acceptor concentration in a central portion, and is smaller than $3.0 \times 10^{19}/cm^3$.

10 Claims, 4 Drawing Sheets

(51) Int. Cl.
*C30B 33/02* (2006.01)
*H01L 29/36* (2006.01)
*H01L 29/16* (2006.01)
*H01L 21/203* (2006.01)
*C30B 23/06* (2006.01)

(52) U.S. Cl.
CPC ............ *C30B 33/02* (2013.01); *H01L 21/203* (2013.01); *H01L 29/1608* (2013.01)

(56) References Cited

U.S. PATENT DOCUMENTS

| | | | |
|---|---|---|---|
| 2007/0262322 A1 | 11/2007 | Nakabayashi et al. | |
| 2010/0308344 A1* | 12/2010 | Seki | C30B 15/00 257/77 |
| 2012/0025153 A1 | 2/2012 | Hirose et al. | |
| 2014/0283736 A1* | 9/2014 | Nishio | H01L 21/02634 117/93 |
| 2017/0170279 A1 | 6/2017 | Domoto et al. | |

FOREIGN PATENT DOCUMENTS

| | | |
|---|---|---|
| JP | 2003-073194 A | 3/2003 |
| JP | 2015-030640 A | 2/2005 |
| JP | 2006-111478 A | 4/2006 |
| JP | 2008-290898 A | 12/2008 |
| JP | 2010-064918 A | 3/2010 |
| JP | 2011093771 A | 5/2011 |
| JP | 2011-219297 A | 11/2011 |
| JP | 2012-031014 A | 2/2012 |
| WO | 2015/129876 A1 | 9/2015 |

OTHER PUBLICATIONS

K. Irmscher et al., "Formation and properties of stacking faults in nitrogen-doped 4H-SiC", Physica B, 2006, pp. 338-341, vols. 376-377.

Thomas A. Kuhr et al., "Spontaneous formation of stacking faults in highly doped 4H-SiC during annealing", J. Appl. Phys., 2002, pp. 5863-5871, vol. 92.

Rusheng Wei et al., "Characterization of Nitrogen-Boron doped 4H-SiC substrates", Int. J. Electrochem. Sci., 2013, pp. 7099-7106, vol. 8.

Shin-Ichi Nishizawa et al., "Effect of heat transfer on macroscopic and microscopic crystal quality in silicon carbide sublimation growth", Journal of Crystal Growth, 2007, pp. 342-344, vol. 303.

International Search Report of PCT/JP2017/034499 dated Nov. 14, 2017 [PCT/ISA/210].

Communication dated Aug. 19, 2020, from the State Intellectual Property Office of the P.R.C. in application No. 201780057496.8.

* cited by examiner

IMPURITY ANALYSIS DATA

| MEASUREMENT POSITION | IMPURITY CONCENTRATION ($\times 10^{19}/cm^3$) | | |
|---|---|---|---|
| | N | Al | N−Al |
| ① | 5.0 | 2.0 | 3.0 |
| ② | 3.5 | 1.4 | 2.1 |

N-TYPE SIC SINGLE CRYSTAL SUBSTRATE, METHOD FOR PRODUCING SAME AND SIC EPITAXIAL WAFER

CROSS REFERENCE TO RELATED APPLICATIONS

This application is a National Stage of International Application No. PCT/JP2017/034499, filed Sep. 25, 2017, claiming priority based on Japanese Patent Application No. 2016-186907, filed Sep. 26, 2016, the contents of all of which are incorporated herein by reference in their entirety.

TECHNICAL FIELD

The present invention relates to an n-type SiC single crystal substrate and a method for producing the same, and a SiC epitaxial wafer.

BACKGROUND ART

Silicon carbide (SiC) has a dielectric breakdown field that is one order of magnitude larger, and a band gap that is about three times larger, than those of silicon (Si). In addition, silicon carbide (SiC) has superior properties such as a thermal conductivity that is approximately three times higher than that of silicon (Si). Because of such properties, silicon carbide (SiC) is expected to be applied to power devices, high frequency devices, high temperature operation devices, and the like.

SiC single crystals have polymorphs, such as 3C-SiC, 4H-SiC and 6H-SiC, that is, various crystal structures. The polymorphs occur due to the fact that the crystal structures of SiC do not differ as the outermost surface structures when viewed from the c-axis direction (<000-1> direction).

Among these polymorphs, 4H-SiC single crystals have particularly high mobility. For this reason, they are expected to be used for power devices.

Depending on the device structure, not only an n-type single crystal substrate but also a p-type single crystal substrate is required for manufacturing a SiC power device or the like. However, for reasons such as ease of fabrication, many studies have been made on n-type SiC single bulk crystals, as compared with p-type single bulk crystals, for lowering resistivity and the like. Therefore, when an electronic device such as a power device is manufactured using a SiC single crystal substrate, an n-type SiC single crystal substrate with low resistivity is usually used as a base substrate.

In general, nitrogen is used as a donor element in an n-type SiC single crystal substrate. The nitrogen atom doped in the SiC single crystal acts as a donor, when the nitrogen atom substitutes carbon atom.

In SiC power devices, it is important to reduce the on-resistance value of the device by lowering the resistivity of the single crystal substrate. By increasing the concentration of doped nitrogen, the resistivity of the n-type SiC single crystal substrate can be lowered.

However, the stacking fault density increases as the concentration of nitrogen increases. In particular, there is a report that when the concentration of nitrogen is increased to more than $2 \times 10^{19}/cm^3$, stacking faults density are further increased during crystal growth, and the crystallinity is significantly degraded (Patent Document 1).

On the other hand, Patent Document 1 and Non-Patent Document 1 disclose that stacking faults generated during crystal growth of an n-type SiC single crystal substrate (as-grown substrate) can be reduced by doping both the donor element and the acceptor element. In particular, Patent Document 1 discloses that by setting the value obtained by subtracting the concentration of the acceptor element from the concentration of the donor element in the substrate (hereinafter referred to as "(donor concentration)-(acceptor concentration)" in some cases) to $1 \times 10^{21}/cm^3$ or less, stacking faults can be largely suppressed in an n-type SiC single crystal substrate (Patent Document 1 and Non-Patent Document 1).

On the other hand, there are reports that when a high-temperature treatment at 1,000° C. or more was performed in the growth process such as an epitaxial growth using a 4H-SiC single crystal substrate having a nitrogen concentration of exceeding $2.0 \times 10^{19}/cm^3$, high density of double stacking faults (double Shockley-type stacking faults) were formed (Non-Patent Documents 2 and 3).

In addition, Non-Patent Document 3 shows that double Shockley-type stacking faults (DSSFs) tend to be generated easily by the nitrogen concentration increase during high-temperature treatment.

As described above, although it is desirable to increase the nitrogen concentration in order to reduce the resistivity, there was a dilemma that when the nitrogen concentration is increased, a large number of double Shockley-type stacking faults are generated due to the high-temperature treatment.

On the other hand, Patent Document 2 and Patent Document 3 describe that a double Shockley-type stacking fault generated during a high-temperature treatment of such a SiC single crystal substrate with low resistivity is a stacking fault different from usual stacking faults caused by mechanical stress and the like. Furthermore, it has been reported that the formation of double Shockley-type stacking faults can be suppressed by polishing the surface, the back surface, and the outer peripheral side surface of a low resistivity substrate so as to have a predetermined surface roughness (see Patent Document 2 or Patent Document 3).

Meanwhile, when a wafer (substrate) is sliced from a SiC single crystal ingot, a sharp edge is present on the processed outer peripheral portion. In order to chamfer this edge, a beveling process is performed. However, it is not easy to reduce the surface roughness of the outer peripheral portion in the substrate on which the beveling process has been performed.

Therefore, even if the method described in Patent Document 2 or Patent Document 3 is applied to the outer peripheral portion of the SiC single crystal substrate, it is expected that the double Shockley-type stacking faults generated due to the high-temperature treatment cannot be sufficiently suppressed. In other words, it is expected that double Shockley-type stacking faults will remain. When the number of steps for reducing the surface roughness of the outer peripheral portion of the substrate is increased more than usual in order to reduce such stacking faults, the production cost of the SiC single crystal substrate increases.

CITATION LIST

Patent Documents

Patent Document 1: Japanese Unexamined Patent Application, First Publication No. 2015-30640
Patent Document 2: Japanese Unexamined Patent Application, First Publication No. 2008-290898

Patent Document 3: Japanese Unexamined Patent Application, First Publication No. 2011-219297

Non-Patent Documents

Non-Patent Document 1: T. Kato et al., Mater. Sci. Forum 778-780, (2014) pp 47-50
Non-Patent Document 2: K. Imascher et al., Physica B 376-377 (2006) pp 338-341
Non-Patent Document 3: T. A. Kuhr et al., J. Appl. Phys., Vol. 92 (2002) pp 5865-5871
Non-Patent Document 4: R. Wei et al., Int. J. Electrochem. Sci. 8, (2013) pp 7099-7106
Non-Patent Document 5: S. Nishizawa et al., J. Crystal Growth 303 (2007), 342-344

SUMMARY OF INVENTION

Technical Problem

The present invention has been made in view of the above problems, and has an object to provide a SiC single crystal substrate in which double Shockley-type stacking faults are suppressed from entering a device use region from the outer peripheral portion of the SiC single crystal substrate during a high-temperature treatment, a production method thereof, and a SiC epitaxial wafer.

Solution to Problem

That is, in order to solve the above problems, the present invention provides an n-type SiC single crystal substrate of a first aspect described below.

(1) An n-type SiC single crystal substrate according to one aspect of the present invention is a substrate doped with both a donor and an acceptor, which is an n-type SiC single crystal substrate where a difference between a donor concentration and an acceptor concentration in an outer peripheral portion of the substrate is smaller than a difference between a donor concentration and an acceptor concentration in a central portion, and the difference between the donor concentration and the acceptor concentration in the outer peripheral portion is smaller than $3.0 \times 10^{19}/cm^3$.

The n-type SiC single crystal substrate according to the first aspect of the present invention preferably includes the following features (2) to (5). It should be noted that it is also preferable to combine these features with each other as necessary.

(2) The difference between the donor concentration and the acceptor concentration in the aforementioned outer peripheral portion may be smaller than $2.0 \times 10^{19}/cm^3$.

(3) The difference between the donor concentration and the acceptor concentration in the central portion may be larger than the difference between the donor concentration and the acceptor concentration in the outer peripheral portion such that the difference between the difference at the central portion and the difference at the outer peripheral portion is more than $1.0 \times 10^{19}/cm^3$.

A second aspect of the present invention is a SiC epitaxial wafer described below.

(4) A SiC epitaxial wafer in which a SiC epitaxial layer is formed on the n-type SiC single crystal substrate according to any one of (1) to (3).

A SiC epitaxial wafer according to the second aspect of the present invention preferably includes the following features (5) to (6). It should be noted that it is also preferable to combine these features with each other as necessary.

(5) In the above epitaxial wafer, a stacking fault density of the aforementioned n-type SiC single crystal substrate may be 5 $cm^{-1}$ or less.

A third aspect of the present invention is a method for producing an n-type SiC single crystal substrate described below.

(6) A method for producing an n-type SiC single crystal substrate, the method including a crystal growth step of laminating a SiC single crystal while co-doping a donor and an acceptor on one surface of a seed crystal by a sublimation recrystallization method, wherein a crystal growth surface is maintained in a convex shape in at least a part of the aforementioned crystal growth step.

The method for producing an n-type SiC single crystal substrate according to the third aspect of the present invention preferably includes the following features (7) to (10). It should be noted that it is also preferable to combine these features with each other as necessary.

(7) In the aforementioned method for producing an n-type SiC single crystal substrate, a heat loading step at 1,000° C. or higher and 2,000° C. or lower is performed on the aforementioned SiC single crystal after the aforementioned crystal growth step.

(8) The aforementioned crystal growth step is a step for producing a SiC single crystal ingot, and includes a step of slicing a substrate from the aforementioned SiC single crystal ingot; a step of performing a beveling process on an outer peripheral portion of the sliced substrate, and a step of performing a high-temperature treatment at 1,000° C. or higher and 2,000° C. or lower after performing the beveling process.

(9) In the aforementioned crystal growth step, crystal growth is performed in an environment in which a temperature in a central portion of the seed crystal is lower than that in an outer peripheral portion of the seed crystal to maintain the crystal growth surface in a convex shape.

(10) In the aforementioned crystal growth step, crystal growth is performed in an environment in which a temperature in a central portion of the seed crystal is lower than that in an outer peripheral portion of the seed crystal.

Effects of Invention

According to the n-type SiC single crystal substrate of the present invention, it is possible to provide a SiC single crystal substrate in which double Shockley-type stacking faults are suppressed from entering a device use region from the outer peripheral portion of the SiC single crystal substrate during a high-temperature treatment. Since the number of double Shockley-type stacking faults is small, the resistivity of the device region is low, and the crystallinity is excellent.

According to the SiC epitaxial wafer of the present invention, it is possible to provide a SiC epitaxial wafer obtained by forming a SiC epitaxial layer on a SiC single crystal substrate in which double Shockley-type stacking faults are suppressed from entering a device use region from the outer peripheral portion of the SiC single crystal substrate during a high-temperature treatment. Since it has both low resistivity and excellent crystallinity, the performance is excellent.

According to the method for producing an n-type SiC single crystal substrate of the present invention, it is possible to provide a method for producing a SiC single crystal substrate in which double Shockley-type stacking faults are suppressed from entering a device use region from the outer peripheral portion of the SiC single crystal substrate during a high-temperature treatment.

DESCRIPTION OF EMBODIMENTS

Figure 1:
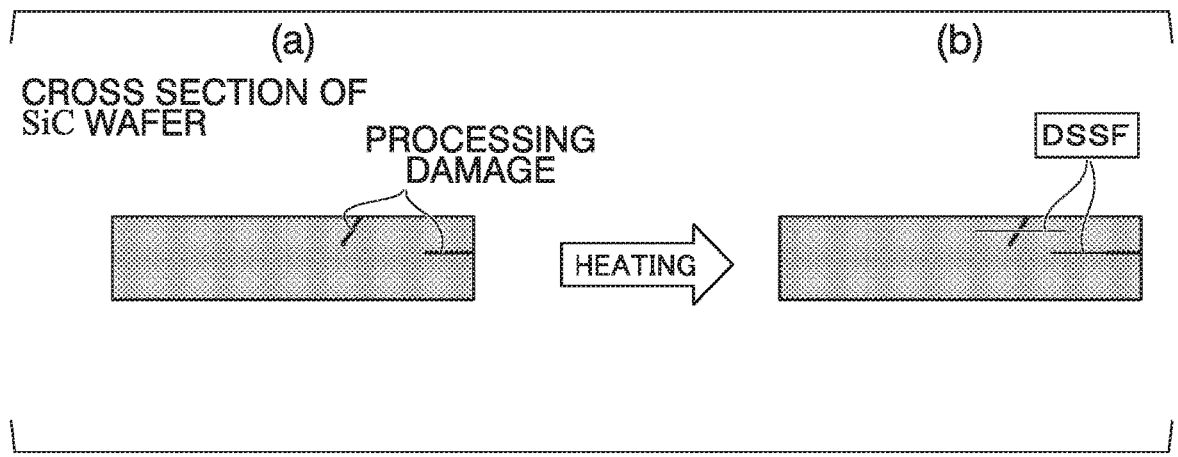
FIG. 1 is a schematic cross-sectional view of a general SiC single crystal substrate before and after a high-temperature treatment.

Hereinafter, the present invention will be described in detail with appropriate reference to the drawings.

It should be noted that in the drawings used in the following description, characteristic portions and components may be shown in an enlarged manner in some cases for the sake of simplicity in order to facilitate understanding of the characteristics of the present invention, and the dimension, the ratio and the like of each constituent element may be different from actual dimension, ratio and the like. In addition, materials, dimensions, and the like exemplified in the following description are merely examples, and the present invention is not limited thereto and can be carried out with appropriate modifications within a range that achieves the effects of the present invention.

FIG. 1 shows a schematic cross-sectional view of a SiC single crystal substrate before and after a high-temperature treatment. (a) of FIG. 1 shows a schematic cross-sectional view of the SiC single crystal substrate before the high-temperature treatment. (b) of FIG. 1 shows a schematic cross-sectional view of the SiC single crystal substrate after the high-temperature treatment.

In (a) of FIG. 1, it is schematically shown that there are damages due to a beveling process on the front side or back side surface and on the outer peripheral side surface. In (b) of FIG. 1, it is schematically shown that a double Shockley-type stacking fault forms due to the processing damage after the high-temperature treatment, and this expands and eventually extends into a device use region.

In the present specification, a device use region (central portion) refers to a region used as a chip, that is, a portion excluding a predetermined outer peripheral vicinity portion, which is a portion where a chip is actually manufactured. In other words, the device use region (central portion) refers to a region facing an edge exclusion region (outer peripheral portion) which is not used as a chip, that is, a region including the aforementioned central portion of the substrate. The edge exclusion region is a region advanced from the outermost periphery (peripheral edge) of the SiC single crystal substrate (wafer) to a predetermined distance toward the center, for example, a substantially donut-shaped region. For example, a region that is advanced from the outermost periphery to the central direction of the wafer by 2 mm is set as the edge exclusion region, but it is not limited only thereto. A region inside the edge exclusion region is the device use region.

In other words, the "outer peripheral portion" is a portion (region) which may be subjected to a beveling process in the SiC single crystal substrate. The "central portion" is a portion (region) on the more central side of the SiC single crystal substrate than the "outer peripheral portion". For example, the "outer peripheral portion" may be a portion (region) of 2 mm from the outermost periphery toward the central direction of the wafer.

A chip such as a power device is fabricated by processing the device use region. Therefore, it is preferable that the device use region has favorable crystallinity, and additionally, it is also desirable that the resistivity is low.

As described above, FIG. 1 shows a state where a double Shockley-type stacking fault forms in a general SiC single crystal substrate. As schematically shown in FIG. 1, the double Shockley-type stacking fault is generated due to damage caused by the beveling process on the outer peripheral side surface of the SiC single crystal substrate. Then, the fault expands and enters (invades) into the device use region. It is desirable that the double Shockley-type stacking fault does not invade the device use region.

The inventors of the present invention focused on the double Shockley-type stacking faults, and as a result of intensive studies, found the following.

First, by a sublimation recrystallization method, a SiC single crystal is grown while co-doping a donor and an acceptor on a (000-1) C plane of a seed crystal or a plane having an off angle with respect to this C plane, thereby producing a SiC single crystal ingot. At this time, crystal growth is performed by maintaining the crystal growth surface in a convex shape. As a result, the obtained SiC single crystal ingot is sliced on the C plane or on a plane having an off angle with respect to this C plane to obtain a SiC single crystal substrate (wafer). Then, the value of "(donor concentration)-(acceptor concentration)" in the outer peripheral portion of the wafer becomes smaller than that in the central portion.

That is, when the above-described production method is carried out, the incorporated amount (concentration) of nitrogen (N) as a donor is large in the (000-1) C plane (just plane) and decreases when deviated from the C plane (just plane). On the other hand, the incorporated amount (concentration) of aluminum (Al) or boron (B) as an acceptor does not depend on such plane direction, and the in-plane concentration is substantially uniform. The inventors of the present invention have discovered these facts. It also made this discovery even better.

More specifically, the concentration of nitrogen (donor) is high in the (000-1) C plane (just plane) and decreases as it deviates from the C plane (just plane), thereby exhibiting plane orientation dependence. On the other hand, the concentration of aluminum (Al) or boron (B) has almost no plane orientation dependence in the vicinity of the C plane. Therefore, the value of "(donor concentration)-(acceptor concentration)" in the outer peripheral portion of the SiC single crystal substrate can be made smaller than that in the central portion.

When the value of "(donor concentration)-(acceptor concentration)" is low, double Shockley-type stacking faults are less likely to form. Further, as described later, even if a double Shockley-type stacking fault forms, when the value of "(donor concentration)-(acceptor concentration)" is low, the expansion velocity of the double Shockley-type stacking fault decreases. Consequently, it is possible to prevent the fault from entering the device use region from the outer peripheral portion of the SiC single crystal substrate during the high-temperature treatment. It should be noted that when the value of "(donor concentration)-(acceptor concentration)" is high in the central portion, the effect of lowering the resistivity in the device use region can be obtained.

n-Type SiC Single Crystal Substrate

An n-type SiC single crystal substrate according to one aspect of the present invention has a first principal plane, a second principal plane (back surface) and an outer peripheral side surface, and is a substrate doped with both a donor and an acceptor. In addition, the difference between the donor concentration and the acceptor concentration in the outer peripheral portion is smaller than the difference between the donor concentration and the acceptor concentration in the central portion, and the difference between the donor concentration and the acceptor concentration in the outer peripheral portion is smaller than $3.0 \times 10^{19}/cm^3$.

The difference between the donor concentration and the acceptor concentration in the outer peripheral portion is preferably smaller than $2.0 \times 10^{19}/cm^3$. Incorporation of double Shockley-type stacking faults into the central portion can be significantly suppressed.

Further, in order to obtain the effect of further lowering the resistivity in the device use region, it is preferable that the difference between the donor concentration and the acceptor concentration is larger in the central portion than in the outer peripheral portion by more than $1.0 \times 10^{19}/cm^3$. Since the effect of lowering the resistivity in the central portion is further improved, it is more preferable that the difference is larger in the central portion than in the outer peripheral portion by more than $1.4 \times 10^{19}/cm^3$. In the example shown in FIG. 6, there is a difference of about $1.5 \times 10^{19}/cm^3$ at the maximum.

It should be noted that the donor concentration and acceptor concentration in the outer peripheral portion and the donor concentration and acceptor concentration in the central portion can be arbitrarily selected.

For example, the donor concentration in the outer peripheral portion is preferably from $2.0 \times 10^{19}$ to $1.0 \times 10^{20}/cm^3$, and more preferably from $3.0 \times 10^{19}$ to $8.0 \times 10^{19}/cm^3$. The acceptor concentration in the outer peripheral portion is preferably from $0.5 \times 10^{19}$ to $8.0 \times 10^{19}/cm^3$, and more preferably from $1.0 \times 10^{19}$ to $6.0 \times 10^{19}/cm^3$.

The donor concentration in the central portion is preferably from $3.0 \times 10^{19}$ to $1.2 \times 10^{20}/cm^3$, and more preferably from $5.0 \times 10^{19}$ to $1.2 \times 10^{20}/cm^3$. The acceptor concentration in the central portion is preferably from $0.5 \times 10^{19}$ to $8.0 \times 10^{19}/cm^3$, and more preferably from $1.0 \times 10^{19}$ to $6.0 \times 10^{19}/cm^3$. The difference between the donor concentration and the acceptor concentration in the central portion is preferably from $2.0 \times 10^{19}$ to $9.0 \times 10^{19}/cm^3$, and more preferably from $3.0 \times 10^{19}$ to $9.0 \times 10^{19}/cm^3$.

The n-type SiC single crystal substrate of the present invention is preferably an n-type 4H-SiC single crystal substrate. The size and thickness of the substrate may be arbitrarily selected. The resistivity of the substrate can also be arbitrarily selected. For example, the average resistivity is preferably from 1 to 15 mΩ·cm, and more preferably from 3 to 10 mΩ·cm.

As the donor, any one of nitrogen, phosphorus and arsenic which are group V elements can be preferably used. Further, as the acceptor, any one of aluminum, boron and gallium which are group III elements can be preferably used.

Figure 2:
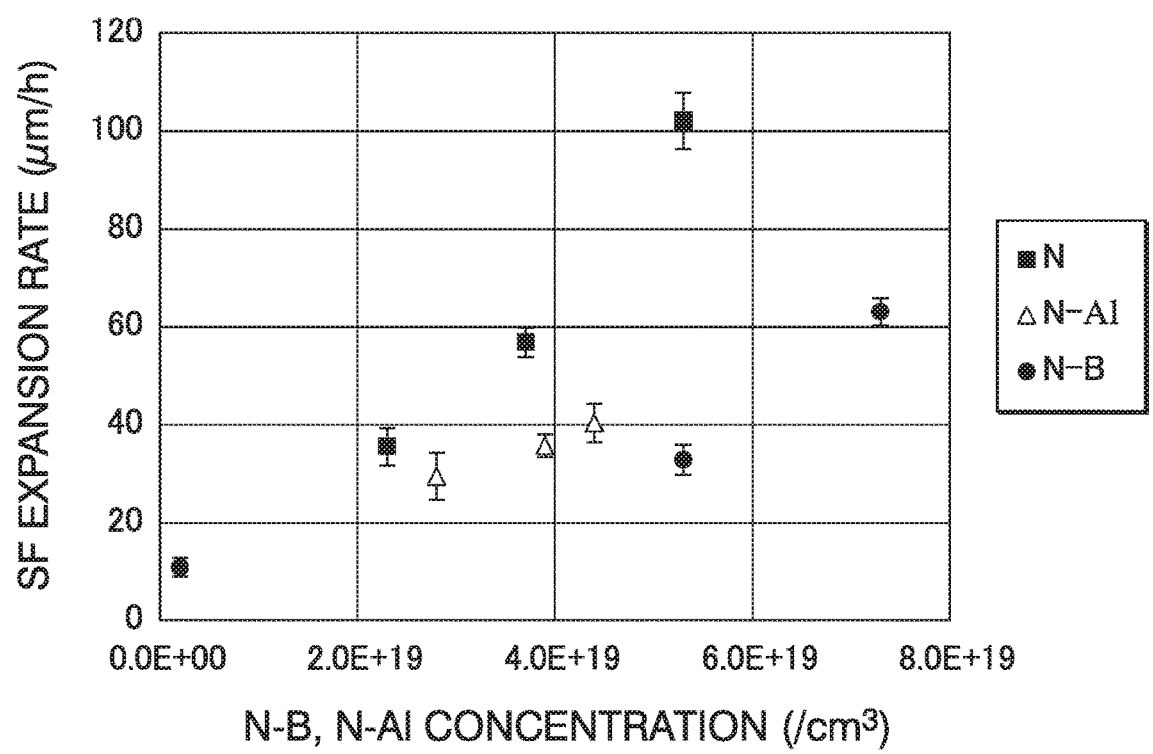
FIG. 2 is a graph obtained by evaluating a substrate in which the "(donor concentration)-(acceptor concentration)" value is plotted on the horizontal axis and the expansion velocity of stacking fault is plotted on the vertical axis.

FIG. 2 is a graph obtained by producing a plurality of substrates having the same shape using nitrogen as a donor and Al or B as an acceptor, and performing an evaluation using samples of their crystal sections. It is a graph in which the horizontal axis represents the value of "(donor (N) concentration)-(acceptor (Al or B) concentration)" in the outer peripheral portion and the vertical axis represents the expansion velocity of the stacking fault, based on the evaluation results of these samples.

For comparison, a sample of the same shape doped only with nitrogen was prepared and evaluated in the same manner, which was plotted on the graph. In the case of this comparative sample, the horizontal axis represents the nitrogen concentration. Further, this comparative sample was produced by the same method as the method for producing a compound co-doped with nitrogen and boron, with the exception that only nitrogen was used.

In the present invention, the value of "(donor (N) concentration)-(acceptor (Al, B) concentration)" of the substrate can be measured by a quantitative analysis such as SIMS (secondary ion mass spectrometry). Alternatively, the value of "(donor (N) concentration)-(acceptor (Al, B) concentration)" can also be derived from the following equation (1) based on the measurement data of the resistivity. The value obtained using the equation (1) is used as the value of "(donor (N) concentration)-(acceptor (Al, B) concentration)" in FIG. 2.

$$I = n/a = 1/a\rho\mu e \quad (1)$$

I: Estimated value of "(donor (N) concentration)-(acceptor (Al, B) concentration)"
a: Activation ratio, an assumed value of 0.65 is used.
n: Carrier concentration
ρ: Resistivity, measurement data are used.
μ: Mobility, an assumed value of 30 ($cm^2$/Vs) is used.
e: Elementary charge, $1.602 \times 10^{-19}$ coulombs
The resistivity was measured by an eddy current method.
Further, for the activation ratio and mobility, values estimated by Hall measurement of crystals having the same level of carrier concentration were used.

The inventors have found that when the value of "(donor concentration)-(acceptor concentration)" of the outer peripheral portion is low, there is an effect of suppressing the expansion of stacking faults generated when a high-temperature treatment is applied to the SiC single crystal substrate (wafer).

That is, as shown in FIG. 2, it was found that in an experiment comparing the case of single doping of nitrogen and the case of doping using two kinds of dopants, as the value of "(donor concentration)-(acceptor concentration)" obtained as a value of the outer peripheral portion of the substrate after the high-temperature treatment increases, the difference in the expansion velocity of stacking fault increases. Conventionally, it has been known that co-doping suppresses the formation of stacking faults during growth of a SiC single crystal (ingot). However, the relationship with stacking faults that form when a high-temperature treatment is applied to the SiC single crystal substrate (wafer) has not been clear to date.

This time, in order to investigate this relationship, the expansion velocity of the stacking fault shown in FIG. 2 was obtained by the following method.

First, an indentation is formed by a micro-hardness tester. The indentation is taken as the starting point of the stacking fault. Thereafter, the SiC single crystal substrate (wafer) having the indentation is heated in an argon atmosphere at 1,000° C. for 2 hours. After that, melt KOH etching is performed at 500° C. for 3 to 5 minutes. As a result, an etch pit of the stacking fault was formed. The distance from the starting point to the edge of the etch pit was measured using an optical microscope. By dividing this distance with the heating time of 2 hours, the expansion velocity of the stacking fault was obtained. It should be noted that the method for producing the substrate used in FIG. 2 will be described later.

From FIG. 2, in the case of co-doping nitrogen and aluminum or boron when the value of "(nitrogen concentration)-(aluminum concentration)" or "(nitrogen concentration)-(boron concentration)" which is a concentration difference in the outer peripheral portion is the same value as the nitrogen concentration, it is clear that the expansion velocity of the stacking fault is slower than in the case of doping only nitrogen.

Further, also in the case of co-doping, it can be seen that the expansion velocity of the stacking fault is slower in the case of co-doping nitrogen and boron than in the case of co-doping nitrogen and aluminum.

In the aforementioned Patent Document 1, it has been reported that the stacking fault increases and the crystallinity is significantly lowered when the nitrogen concentration is greater than $2 \times 10^{19}/cm^3$. In FIG. 2, assuming that this value of $2 \times 10^{19}/cm^3$ is a critical concentration at which the stacking fault is increased and the crystallinity is significantly lowered, the expansion velocity of the stacking fault at this nitrogen concentration seems to correspond to about 30 μm/h. That is, it can be considered that when the nitrogen concentration is a value such that the expansion velocity of the stacking fault exceeds about 30 μm/h, the stacking fault increases, and the crystallinity significantly deteriorates.

Accordingly, also in the case of co-doping, it is preferable not to exceed this expansion velocity of the stacking fault of 30 μm/h. In the co-doping, the value of "(donor concentration)-(acceptor concentration)" at an expansion velocity of stacking fault of 30 μm/h is defined as a critical value (critical concentration) which indicates whether or not the stacking fault increases, and the crystallinity significantly deteriorates. Further, by making the value of "(donor concentration)-(acceptor concentration)" to be smaller than the above critical value of "(donor concentration)-(acceptor concentration)", it is considered that an increase in the stacking fault can be preferably suppressed. The concentration is $3.0 \times 10^{19}/cm^3$ when it is taken to be approximately in the middle between that in the case of co-doping nitrogen and boron and that in the case of co-doping nitrogen and aluminum.

Therefore, in the n-type SiC single crystal substrate of the present invention, the difference between the donor concentration and the acceptor concentration in the outer peripheral portion is made smaller than $3.0 \times 10^{19}/cm^3$. It is more preferable if the difference between the donor concentration and the acceptor concentration in the outer peripheral portion is smaller than $2.0 \times 10^{19}/cm^3$.

A method for producing a SiC single crystal substrate will be described, which is a sample where the data shown in FIG. 2 was obtained. In the present invention, the following method can be preferably used for producing a substrate.

Method for Producing Substrate for Co-Doping Nitrogen and Aluminum

First, a method for producing an n-type 4H-SiC single crystal substrate co-doped with nitrogen (N) and aluminum (Al) will be described.

Figure 3:
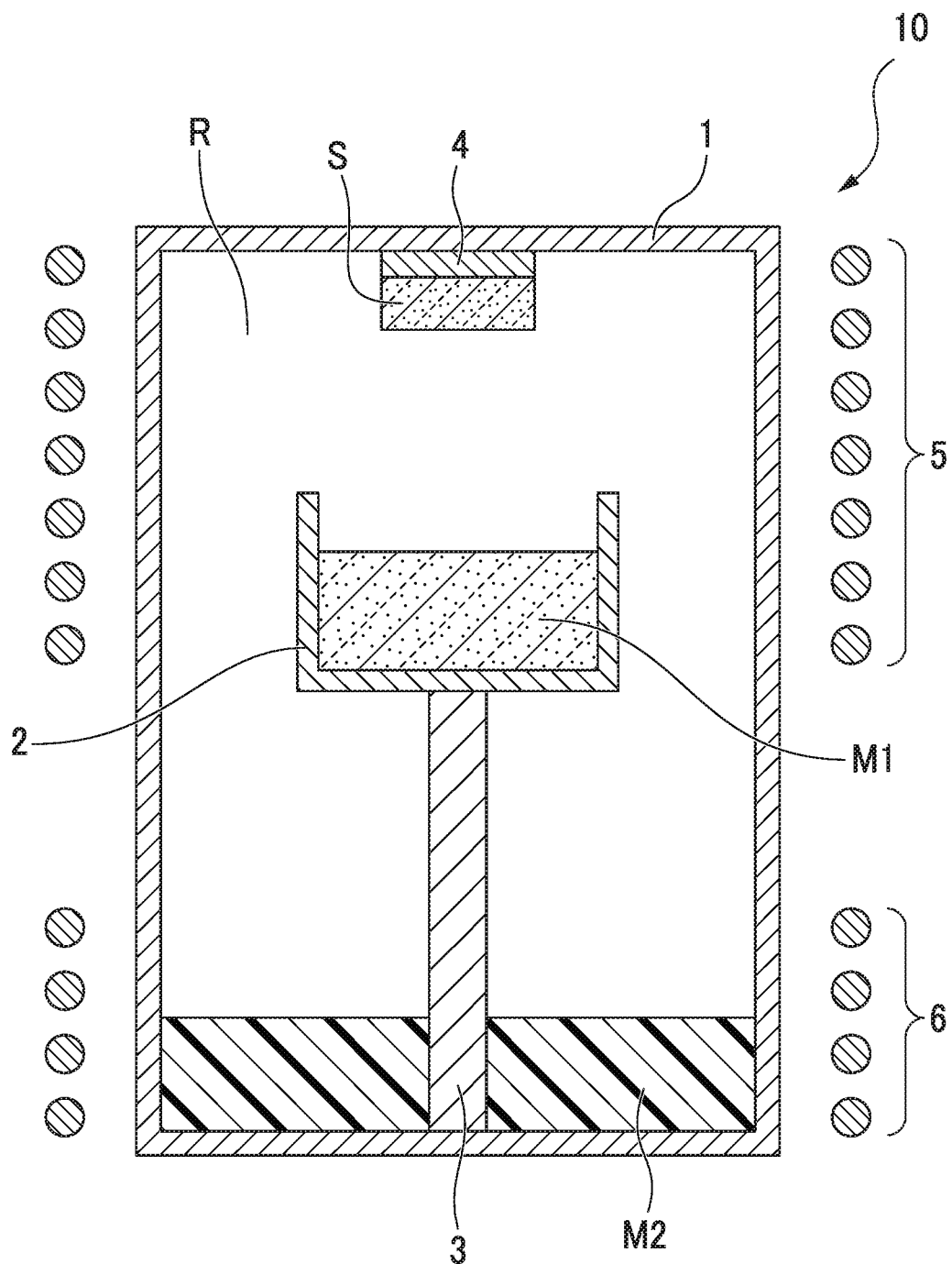
FIG. 3 is a schematic cross-sectional view showing an example of an apparatus for producing a SiC single crystal.

FIG. 3 is a schematic cross-sectional view showing an example of a SiC single crystal production apparatus for producing a SiC single crystal substrate. A SiC single crystal production apparatus 10 includes a crucible 1 for forming a reaction space R, a holding section 2 capable of holding a SiC raw material M1, a supporting section 3 for supporting the holding section 2, an installation section 4 capable of installing a seed crystal S, a first coil (heater) 5 for heating a first region, and a second coil (heater) 6 for heating a second region. An aluminum raw material M2 can be installed in a bottom portion of the crucible 1. Hereinafter, a method for producing an n-type 4H-SiC single crystal will be described using the SiC single crystal production apparatus 10 as an example.

It is preferable to use a 4H-SiC crystal as the seed crystal and to install it on the installation section 4 so that the (000-1) C plane becomes the growth surface.

First, the SiC raw material M1 and the aluminum raw material M2 are prepared.

As the SiC raw material M1, in general, a widely used SiC powder or the like can be used. The aluminum raw material M2 may be either a nitrided aluminum compound or a non-nitrided aluminum compound. Examples of the nitrided aluminum compound include aluminum nitride and a compound of aluminum nitride and aluminum carbide, and examples of the non-nitrided aluminum compound include aluminum carbide and the like.

It is preferable that the SiC raw material M1 and the aluminum raw material M2 are installed separately from each other, but the configuration is not limited thereto.

For example, the SiC raw material M1 can be installed in the holding section 2, and the aluminum raw material M2 can be installed in the bottom portion of the crucible 1.

Next, the SiC raw material M1 and the aluminum raw material M2 are sublimated. It is preferable to sublimate the SiC raw material M1 and the aluminum raw material M2 at different temperatures.

In a range of 1500° C. to 2500° C., a vapor pressure of the SiC raw material M1 is lower than a vapor pressure of the aluminum raw material M2. Therefore, when the aluminum raw material M2 is heated under a condition in which an ordinary SiC raw material M1 is sublimated, a sublimation rate of the aluminum raw material M2 becomes excessive, thereby causing problems in the adjustment of a doping amount of aluminum and in the growth of SiC crystal. These problems can be solved by installing the SiC raw material M1 and the aluminum raw material M2 separately from each other and performing temperature control of the respective materials with different coils.

Different control of the temperatures of the SiC raw material M1 and the aluminum raw material M2 can be realized by using the first coil (heater) 5 and the second coil (heater) 6. For example, it is designed so that the first coil 5 heats the first region in the crucible 1 where the SiC raw material M1 is present, and the second coil 6 heats the second region in the crucible 1 where the aluminum raw material M2 is present. As a result, the temperatures of the SiC raw material M1 and the aluminum raw material M2 can be separately controlled. More specifically, it is preferable to set the temperature by the first coil 5 to about 2,200 to 2,500° C. at which the SiC raw material M1 can be sublimated, and to set the temperature by the second coil 6 to about 1,700 to 2,000° C. at which the aluminum raw material M2 can be sublimated.

Further, as shown in FIG. 2, three samples having different values of ((N concentration)−(Al concentration)) were produced by changing the temperature of the aluminum raw material M2 portion.

Nitrogen gas is supplied into the reaction space R. Nitrogen gas can be supplied through the crucible 1. The crucible 1 can have a nitrogen gas permeability. In this case, nitrogen gas can be supplied into the reaction space R by setting an atmosphere surrounding the crucible 1 to an atmosphere mixed with nitrogen gas, without providing a gas supply section in the crucible 1.

By such a method, an ingot suitable for obtaining a desired n-type 4H-SiC single crystal substrate can be obtained.

Further, the temperature distribution of the seed crystal may be changed by changing the structure and members of the installation section 4. All of the three samples having different values of ((N concentration)-(Al concentration)) shown in FIG. 2 were produced, so that the growth surface was made into a convex surface, by making the temperature of the central portion of the seed crystal lower than that of the outer peripheral portion of the seed crystal.

Method for Producing Substrate for Co-Doping Nitrogen and Boron

Next, a method for producing an n-type 4H-SiC single crystal substrate co-doped with nitrogen (N) and boron (B) will be described.

The vapor pressure of boron carbide ($B_4C$) which can be used as the boron raw material is lower than the vapor pressure of aluminum carbide ($Al_4C_3$) by about 3 orders of magnitude. Accordingly, a boron carbide powder can be heated with the same heater as that used for the SiC raw material powder. Therefore, for the n-type 4H-SiC single crystal substrate co-doped with nitrogen (N) and boron (B), an ordinary SiC single crystal production apparatus which is the same as the apparatus for producing an n-type 4H-SiC single crystal substrate doped only with nitrogen can be used (for example, see Non-Patent Document 4). The boron carbide powder and the SiC raw material powder may be mixed and used. By mixing the boron carbide powder and the SiC raw material powder, SiC single crystals co-doped with nitrogen and boron can be produced by using the same SiC single crystal manufacturing step as that of the ordinary production method in which only nitrogen is used.

It is preferable that the seed crystal is a 4H-SiC crystal and is installed so that the (000-1) C plane becomes the growth surface.

The temperature can be set so that the seed crystal is at an arbitrarily selected temperature of, for example, 2,100° C. to 2,150° C.

Among the raw material powders, the proportion of the $B_4C$ powder can be set to, for example, about 0.001 to 0.1 wt. %. The temperature can be set so that the raw material powders of the SiC powder and the $B_4C$ powder are at a temperature of, for example, 2,250° C. to 2,300° C.

The atmosphere surrounding the crucible can be set to, for example, an atmosphere of argon and nitrogen, and the partial pressure of nitrogen can be set to, for example, 5 to 100%.

By such a method, an ingot suitable for obtaining a desired n-type 4H-SiC single crystal substrate can be obtained.

Further, the temperature distribution of the seed crystal may be changed by changing the structure and members of the installation section 4.

It should be noted that when a N—B compound used in the experiment of FIG. 2 was produced, the proportion of the $B_4C$ powder was 0.05 wt. %, and the atmosphere surrounding the crucible was an atmosphere of argon and nitrogen. Further, it was produced so that the growth surface was made into a convex surface by making the temperature of the central portion of the seed crystal lower than that of the outer peripheral portion of the seed crystal. Furthermore, as shown in FIG. 2, three samples having different values of ((N concentration)-(B concentration)) were produced by changing the flow ratio of nitrogen to argon.

Moreover, in the three samples, the difference between the donor concentration and the acceptor concentration in the outer peripheral portion is smaller than the difference between the donor concentration and the acceptor concentration in the central portion.

Method for Producing n-Type SiC Single Crystal Substrate

A method for producing an n-type SiC single crystal substrate according to an embodiment of the present invention includes a crystal growth step of laminating a SiC single crystal while co-doping a donor and an acceptor on one surface of a seed crystal by a sublimation recrystallization method. In at least a part of the aforementioned crystal growth step, the crystal growth surface is maintained in a convex shape.

The reason why the crystal growth surface is maintained in a convex shape during the crystal growth step is that the donor concentration is high in the (000-1) C plane (just plane) and decreases as it deviates from the C plane (just plane), thereby exhibiting plane orientation dependence. On the other hand, the acceptor concentration has almost no plane orientation dependence in the vicinity of the C plane. Therefore, the value of "(donor concentration)-(acceptor concentration)" in the outer peripheral portion of the SiC single crystal substrate can be made smaller than that in the central portion. When the value of "(donor concentration)-(acceptor concentration)" is low, double Shockley-type stacking faults are less likely to form. Further, even if a double Shockley-type stacking fault forms, when the value of "(donor concentration)-(acceptor concentration)" is low, the expansion velocity of the double Shockley-type stacking fault decreases. Consequently, since it is possible to prevent the fault from entering the device use region from the outer peripheral portion of the SiC single crystal substrate during the high-temperature treatment, the above feature is preferable.

It should be noted that a SiC single crystal ingot may be obtained by the crystal growth step. The n-type SiC single crystal substrate of the present invention may be obtained by slicing the substrate from the ingot and subjecting the outer peripheral portion of the sliced substrate to a beveling process or the like.

By employing such a production method, the n-type SiC single crystal substrate of the present invention can be preferably produced.

It should be noted that in order to maintain the crystal growth surface in an appropriate convex shape, an arbitrarily selected method may be selected. For example, it is also preferable to perform crystal growth in an environment where the temperature in the central portion of the seed crystal is lower than that in the outer peripheral portion of the seed crystal. The heating temperature can be set so that the seed crystal is at an arbitrarily selected temperature of, for example, 2,100 to 2,150° C. The outer peripheral portion of the seed crystal may mean, for example, a region of 5 mm from the outermost periphery to the central direction. The other part is defined as the central portion of the seed crystal.

Although the temperature difference between the central portion of the seed crystal and the outer peripheral portion of the seed crystal can be arbitrarily set, it is preferably from, for example, 1 to 50° C., and more preferably from 2 to 10° C.

The crystal growth rate is high in the central portion where the temperature is low, and the crystal growth rate is low in the outer peripheral portion where the temperature is high. For this reason, by adopting such a temperature distribution, it is possible to make the crystal growth surface into an appropriate convex shape. It should be noted that although when the temperature distribution in the crystal is increased, a steeper convex shape can be formed, if the temperature distribution is too large, the thermal stress increases, and the generation of cracks and fractures and an increase in the basal plane dislocation may form in the crystal.

It should be noted that in order to produce the n-type SiC single crystal substrate of the present invention, that is, to make the difference between the donor concentration and the acceptor concentration in the outer peripheral portion to be smaller than $3.0 \times 10^{19}/cm^3$, known methods and conditions can be employed (for example, see Non-Patent Document 5). For example, known methods and conditions can be employed as a method and condition for controlling the temperature environment between the central portion of the seed crystal and the outer peripheral portion of the seed crystal, which make the crystal growth surface into an appropriate convex shape. Further, for example, known methods and conditions can be employed as a method and conditions for setting an appropriate donor concentration and acceptor concentration.

Moreover, the expression "the crystal growth surface is maintained in a convex shape at least in part" may mean that, for example, the crystal growth surface has a protruding portion as a curved surface toward the lower side (reaction space side). Further, the radius of curvature of the convex portion and the size of the bottom surface can be arbitrarily selected.

In the method for producing an n-type SiC single crystal substrate according to an embodiment of the present invention, a heat loading step at 1,000° C. or higher and 2,000° C. or lower may be performed after the aforementioned crystal growth step. Even when such a heat loading step is performed, the stacking fault density of the n-type SiC single crystal substrate is 5 cm$^{-1}$ or less. It should be noted that as an example of the heat loading step, an annealing treatment or the like used for adjusting the crystallinity can be mentioned, but it is not limited thereto.

SiC Epitaxial Wafer

A SiC epitaxial wafer according to an embodiment of the present invention is one in which a SiC epitaxial layer is formed on the n-type SiC single crystal substrate of the present invention.

For forming the SiC epitaxial layer, a known method can be used.

The stacking fault density of the n-type SiC single crystal substrate used for the SiC epitaxial wafer of the present invention is preferably 5 cm$^{-1}$ or less. The stacking fault density of the n-type SiC single crystal substrate is more preferably 2 cm$^{-1}$ or less, and even more preferably 1 cm$^{-1}$ or less.

EXAMPLES

Hereinafter, examples of the present invention will be described. The present invention is not limited only to the following examples.

Example 1

Figures 4, 5:
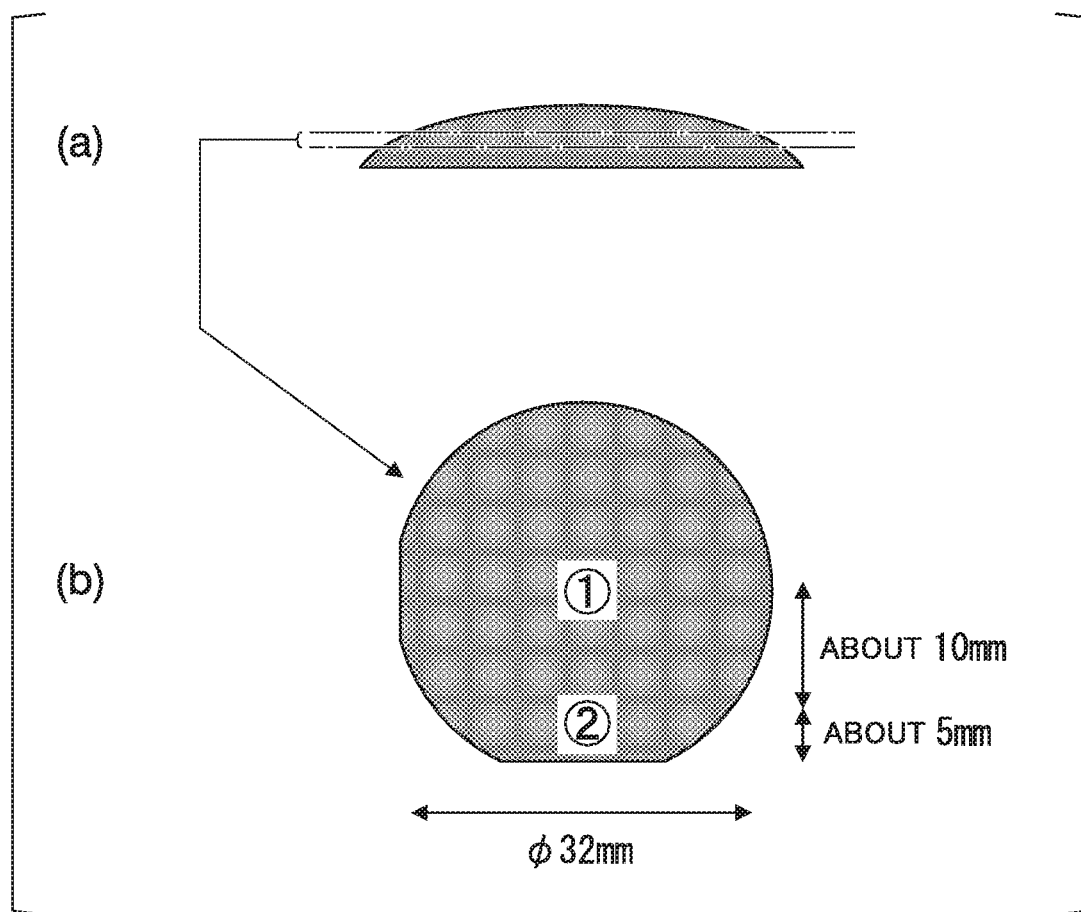
FIG. 4 includes a schematic side view ((a) of FIG. 4) of a SiC single crystal ingot produced using the method for producing an n-type SiC single crystal substrate of the present invention, and a schematic top view ((b) of FIG. 4) of an n-type SiC single crystal substrate having a diameter of 32 mm which is produced from this ingot and used in Example 1.
FIG. 5 is a table showing nitrogen concentrations, aluminum concentrations, and values of ((nitrogen concentration)-(aluminum concentration)) in the outer peripheral portion and the central portion measured at the positions shown in FIG. 4 in Example 1.

Using the method for producing an n-type SiC single crystal substrate according to the present invention, an n-type SiC single crystal substrate having a diameter of 32 mm and shown in FIG. 4 was produced. For the substrate, nitrogen concentrations, aluminum concentrations, and values of ((nitrogen concentration)-(aluminum concentration)) in the outer peripheral portion and the central portion were measured by SIMS (secondary ion mass spectrometry) analysis. Measurements by SIMS were carried out at positions 1 and 2 shown in (b) of FIG. 4 for the outer peripheral portion and the central portion. The results are shown in FIG. 5. The donor was nitrogen, and aluminum was used as the acceptor.

In order to obtain the n-type SiC single crystal substrate shown in FIG. 4, the following method was carried out. First, in order to maintain the crystal growth surface in an appropriate convex shape, crystal growth was performed in an environment where the temperature in the central portion of the seed crystal was lower than that in the outer peripheral portion of the seed crystal. The crystal growth rate is high in the central portion where the temperature is low, and the crystal growth rate is low in the outer peripheral portion where the temperature is high. For this reason, by adopting such a temperature distribution, it was possible to make the crystal growth surface into an appropriate convex shape. In the obtained n-type SiC single crystal substrate of the present invention, the difference between the donor concentration and the acceptor concentration in the outer peripheral portion was smaller than the difference between the donor concentration and the acceptor concentration in the central portion, and this difference between the difference in the outer peripheral portion and the difference in the central portion was smaller than $3.0 \times 10^{19}/cm^3$. A method for controlling the temperature environment between the central portion of the seed crystal and the outer peripheral portion of the seed crystal which makes the crystal growth surface into an appropriate convex shape can also be performed by a known method or the like (for example, refer to Non-Patent Document 5).

Figure 6:
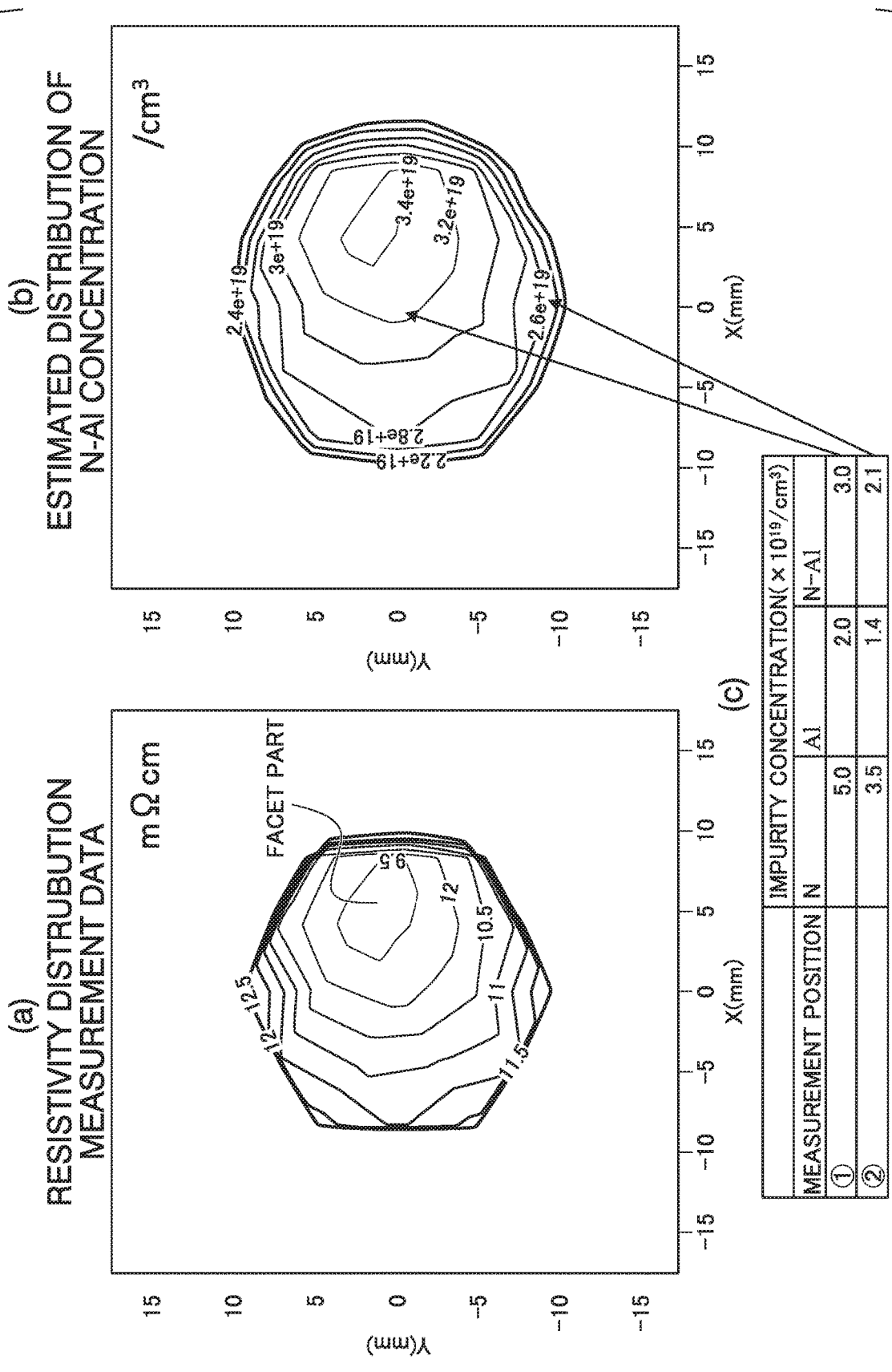
FIG. 6 is a diagram showing a resistivity distribution (the graph on the left) measured by an eddy current method and the estimated ((nitrogen concentration)-(aluminum concentration)) distribution (the graph on the right) calculated based on an equation (1) based on the resistivity distribution, and a table (the table below) showing the values of ((nitrogen concentration)-(aluminum concentration)) in the outer peripheral portion and the central portion measured by SIMS.

FIG. 6 shows a resistivity distribution (the graph on the left, (a) of FIG. 6) measured for the obtained substrate by an eddy current method and the estimated ((nitrogen concentration)-(aluminum concentration)) distribution (the graph on the right, (b) of FIG. 6) calculated based on the above equation (1) based on the resistivity distribution.

The above equation (1) was used only for estimating the "(donor concentration)-(acceptor concentration)" distribution from the measured resistivity distribution. When using the equation (1), for the activation ratio and mobility, values estimated by Hall measurement of crystals having the same level of "donor concentration and acceptor concentration" were used.

The estimated ((nitrogen concentration)-(aluminum concentration)) distribution shown as the right diagram in FIG. 6 ((b) of FIG. 6) corresponded well with the values of ((nitrogen concentration)-(aluminum concentration)) in the outer peripheral portion and the central portion measured by SIMS and shown as the lower diagram in FIG. 6 ((c) of FIG. 6). Based on the measurement data of the resistivity, the effectiveness of calculating "(donor concentration)-(acceptor concentration)" based on the above equation (1) was secured.

Example 2

A SiC epitaxial wafer in which a SiC epitaxial layer was formed at an epitaxial growth temperature of 1,600° C. on the n-type SiC single crystal substrate of Example 1 was fabricated. The layer thickness of the SiC epitaxial layer was 10 and the nitrogen concentration was $1 \times 10^{16}$/cm$^3$. As a result of photoluminescence (PL) mapping, light emission with a peak wavelength (about 500 nm) of the spectrum of the double Shockley-type stacking fault was not observed, and it was found that no stacking fault formed (density of double Shockley-type stacking fault was 0 cm$^{-1}$).

INDUSTRIAL APPLICABILITY

A SiC single crystal substrate in which double Shockley-type stacking faults are suppressed from entering a devise use region from the outer peripheral portion of the SiC single crystal substrate during a high-temperature treatment is provided.

REFERENCE SIGNS LIST

1: Crucible
2: Holding section
3: Supporting section
4: Installation section
5: First coil
6: Second coil
10: SiC single crystal production apparatus
M1: SiC raw material
M2: Aluminum raw material
S: Seed crystal
R: Reaction space

The invention claimed is:

1. An n-type SiC single crystal substrate which is doped with both a donor and an acceptor, wherein
a difference between a donor concentration and an acceptor concentration in an outer peripheral portion of the substrate is smaller than a difference between a donor concentration and an acceptor concentration in a central portion, and
the difference between the donor concentration and the acceptor concentration in said outer peripheral portion is smaller than $3.0 \times 10^{19}$/cm$^3$.

2. The n-type SiC single crystal substrate according to claim 1, wherein the difference between the donor concentration and the acceptor concentration in the outer peripheral portion is smaller than $2.0 \times 10^{19}$/cm$^3$.

3. The n-type SiC single crystal substrate according to claim 1, wherein the difference between the donor concentration and the acceptor concentration in the central portion is larger than the difference between the donor concentration and the acceptor concentration in the outer peripheral portion by more than $1.0 \times 10^{19}$/cm$^3$.

4. A SiC epitaxial wafer having a SiC epitaxial film formed on the n-type SiC single crystal substrate according to claim 1.

5. The epitaxial wafer according to claim 4, wherein a stacking fault density of said n-type SiC single crystal substrate is 5 cm$^{-1}$ or less.

6. A method for producing the n-type SiC single crystal substrate as claimed in claim 1, the method comprising:
a crystal growth step of laminating a SiC single crystal while co-doping a donor and an acceptor on one surface of a seed crystal by a sublimation recrystallization method,
wherein a crystal growth surface is maintained in a convex shape in at least a part of said crystal growth step.

7. The method for producing the n-type SiC single crystal substrate according to claim 6, wherein a thermal loading step at 1,000° C. or higher and 2,000° C. or lower is performed on said laminated SiC single crystal after said crystal growth step.

8. The method for producing the n-type SiC single crystal substrate according to claim 6,
wherein said crystal growth step is a step for producing a SiC single crystal ingot, and comprises:
a step of slicing a substrate from said SiC single crystal ingot;
a step of performing a beveling process on an outer peripheral portion of the sliced substrate, and
a step of performing a heat treatment at 1,000° C. or higher and 2,000° C. or lower after performing the beveling process.

9. The method for producing the n-type SiC single crystal substrate according to claim 6, wherein in said crystal growth step, crystal growth is performed in an environment in which a temperature in a central portion of the seed crystal is lower than that in an outer peripheral portion of the seed crystal to maintain the crystal growth surface in a convex shape.

10. The method for producing the n-type SiC single crystal substrate according to claim 6, wherein in said crystal growth step, crystal growth is performed in an environment in which a temperature in a central portion of the seed crystal is lower than that in an outer peripheral portion of the seed crystal.

* * * * *